US012763789B2

(12) United States Patent
Nakamura

(10) Patent No.: US 12,763,789 B2
(45) Date of Patent: Oct. 13, 2026

(54) SUCCESSIVE APPROXIMATION REGISTER A/D CONVERTER

(71) Applicant: ROHM CO., LTD., Kyoto (JP)

(72) Inventor: Haruaki Nakamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 169 days.

(21) Appl. No.: 18/746,648

(22) Filed: Jun. 18, 2024

(65) Prior Publication Data

US 2024/0340021 A1 Oct. 10, 2024

Related U.S. Application Data

(63) Continuation of application No. PCT/JP2022/043798, filed on Nov. 28, 2022.

(30) Foreign Application Priority Data

Dec. 21, 2021 (JP) ................................ 2021-207455

(51) Int. Cl.

| | |
|---|---|
| ***H03M 1/46*** | (2006.01) |
| ***H03M 1/06*** | (2006.01) |
| ***H03M 1/10*** | (2006.01) |
| ***H03M 1/38*** | (2006.01) |

(52) U.S. Cl.

CPC ......... *H03M 1/462* (2013.01); *H03M 1/0675* (2013.01); *H03M 1/10* (2013.01); *H03M 1/38* (2013.01); *H03M 1/46* (2013.01)

(58) Field of Classification Search

CPC ...... H03M 1/462; H03M 1/0675; H03M 1/10; H03M 1/46; H03M 1/38

USPC ........................ 341/120, 155, 161, 163, 172

See application file for complete search history.

(56) References Cited

U.S. PATENT DOCUMENTS 10,761,135 B2 * 9/2020 Schmalzl ........... H03M 1/1071

FOREIGN PATENT DOCUMENTS

| | | |
|---|---|---|
| JP | 2014135603 A | 7/2014 |
| JP | 2014143639 A | 8/2014 |
| JP | 2017077020 A | 4/2017 |

(Continued)

OTHER PUBLICATIONS

International Search Report and IPRP with Written Opinion of the International Searching Authority for International Application No. PCT/JP2022/043798; mailed Feb. 14, 2023.

(Continued)

*Primary Examiner* — Khai M Nguyen
(74) *Attorney, Agent, or Firm* — CANTOR COLBURN LLP

(57) ABSTRACT

A successive approximation register A/D converter (SARADC) has redundancy. An analog unit samples an analog input voltage and generates a comparison signal indicating a magnitude relationship between a threshold voltage corresponding to a control code and the analog input voltage. A logic unit generates, in an i-th (i≥1) cycle, a first value obtained by adding a weight of an (i+1)-th cycle to a control code of the i-th cycle and a second value obtained by subtracting the weight of the (i+1)-th cycle from the control code of the i-th cycle. When a comparison signal of the cycle is determined, the logic unit supplies one of the first value and the second value corresponding to the comparison signal to the analog unit 110 as a control code of the (i+1)-th cycle.

7 Claims, 10 Drawing Sheets

(56) References Cited

FOREIGN PATENT DOCUMENTS

| | | |
|---|---|---|
| JP | 2017123531 A | 7/2017 |
| JP | 2020065297 A | 4/2020 |

OTHER PUBLICATIONS

JPO Notification of Reasons for Refusal for corresponding JP Application No. 2023-569209; issued May 12, 2026.

* cited by examiner

SUCCESSIVE APPROXIMATION REGISTER A/D CONVERTER

CROSS REFERENCE TO RELATED APPLICATIONS

This application is a continuation under 35 U.S.C. § 120 of PCT/JP2022/043798, filed Nov. 28, 2022, which is incorporated herein by reference, and which claimed priority to Japanese Application No. 2021-207455, filed Dec. 21, 2021. The present application likewise claims priority under 35 U.S.C. § 119 to Japanese Application No. 2021-207455, filed Dec. 21, 2021, the entire content of which is also incorporated herein by reference.

BACKGROUND

1. Technical Field

The present disclosure relates to a successive approximation register A/D converter.

2. Related Art

A successive approximation register (SAR) is used as an A/D converter (ADC: analog to digital converter) of a medium resolution to a high resolution (for example, 8 bits or more). The SARADC samples and holds an input voltage and compares the input voltage with a threshold voltage in the 1st cycle. Then, a threshold voltage in the 2nd cycle is determined according to the comparison result, and comparison is performed again. By repeating this operation, an analog voltage is converted into a digital signal by binary search.

In the SARADC that performs the binary search with a value of 2 as a radix, when an error occurs in the comparison result in any cycle, a correct digital output cannot be obtained. In order to solve this problem, an SARADC (In this specification, it is also simply referred to as a redundant SARADC.) having redundancy with a value other than 2 as the radix has been proposed.

In a redundant SARADC, a delay path of addition and subtraction is inserted into a loop of a successive approximation register, so that operation speed of the SARADC decreases. The decrease in the operation speed becomes more significant as the number of bits of the SARADC increases.

SUMMARY

The present disclosure relates to the SARADC, and an exemplary general purpose of one embodiment thereof is to provide the redundant SARADC in which the decrease in the operation speed is suppressed.

One embodiment of the present disclosure is a successive approximation register A/D converter having redundancy that converts an analog input voltage to a digital output. The successive approximation register A/D converter includes an analog unit that samples an analog input voltage and generates a comparison signal indicating a magnitude relationship between a threshold voltage corresponding to a control code and the analog input voltage, and a logic unit that generates a control code of a next cycle corresponding to the comparison signal for each cycle. The logic unit generates, in an i-th ($i \geq 1$) cycle, a first value obtained by adding a weight of an (i+1)-th cycle to the control code of the i-th cycle and a second value obtained by subtracting the weight of the (i+1)-th cycle from the control code of the i-th cycle, and when the comparison signal of the i-th cycle is determined, supplies one of the first value and the second value corresponding to the comparison signal to the analog unit as the control code of the (i+1)-th cycle.

Note that any combination of the above components and mutual replacement of the components and expressions among methods, apparatuses, systems, and the like are also effective as embodiments of the present disclosure or the present disclosure. Furthermore, the description of this item (SOLUTION TO PROBLEM) does not describe all essential features of the invention, and thus subcombinations of these features described may also be the invention.

BRIEF DESCRIPTION OF DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

Figure 1:
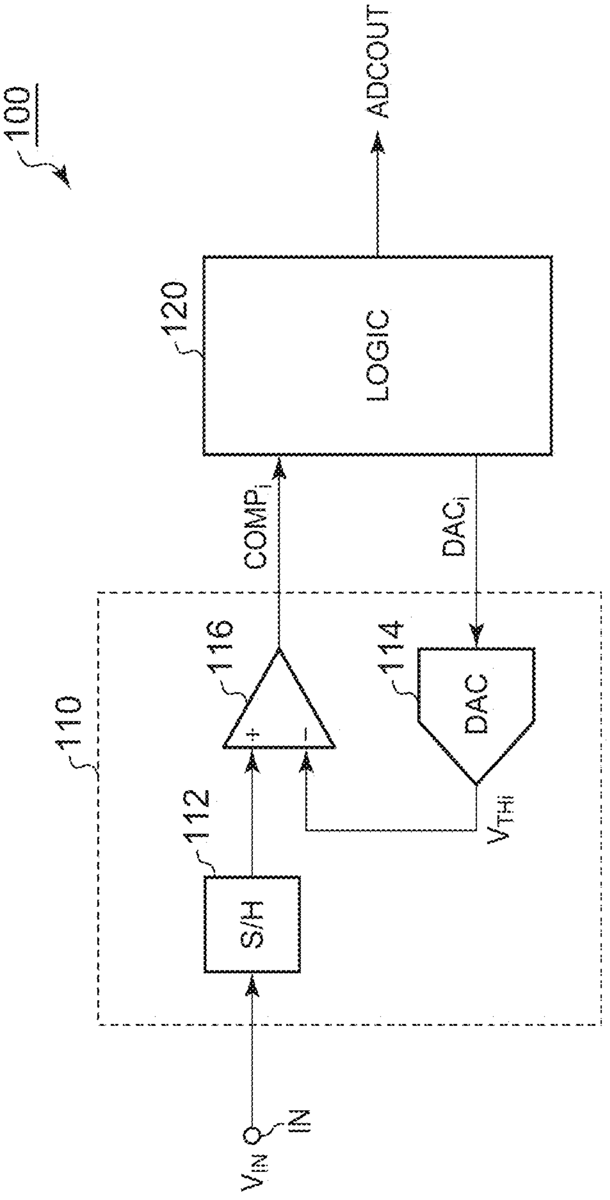
FIG. 1 is a block diagram showing a basic configuration of an SARADC.

An outline of some exemplary embodiments of the present disclosure will be described. This outline describes some concepts of one or more embodiments in a simplified manner for the purpose of basic understanding of the embodiments as a prelude to the detailed description that follows and is not intended to limit the scope of the invention or disclosure. This outline is not a comprehensive outline of all possible embodiments and is not intended to identify key elements of all embodiments or delineate the scope of some or all embodiments. For convenience, the term "one embodiment" may be used to refer to one embodiment (an example or a variation) or a plurality of embodiments (examples or variations) disclosed in the present specification.

The successive approximation register A/D converter according to one embodiment is a successive approximation register A/D converter having redundancy that converts an analog input voltage into a digital output. The successive approximation register A/D converter includes an analog unit that samples an analog input voltage and generates a comparison signal indicating a magnitude relationship between a threshold voltage corresponding to a control code and the analog input voltage, and a logic unit that generates a control code of a next cycle corresponding to the comparison signal for each cycle. The logic unit generates, in an i-th (i≥1) cycle, a first value obtained by adding a weight of an (i+1)-th cycle to the control code of the i-th cycle and a second value obtained by subtracting the weight of the (i+1)-th cycle from the control code of the i-th cycle, and when the comparison signal of the i-th cycle is determined, supplies one of the first value and the second value corresponding to the comparison signal to the analog unit as the control code of the (i+1)-th cycle.

According to this configuration, two candidates of the control code in the next cycle are previously calculated before the determination of the comparison signal, so that the control code of the next cycle can be immediately supplied to the analog unit after the determination of the comparison signal. As a result, delay of calculation can be shortened, and high-speed operation can be realized.

In one embodiment, the successive approximation register A/D converter may further include a first limiter that limits (clamps) the first value to a predetermined upper limit value. As a result, even when the control data temporarily overflows, a comparison operation by the analog unit can be continued.

In one embodiment, the successive approximation register A/D converter may further include a second limiter that limits the second value to a predetermined lower limit value. As a result, even when the control data temporarily underflows, a comparison operation by the analog unit can be continued.

In one embodiment, the logic unit may include a flip-flop that holds the comparison signal, a calculation unit that calculates the first value and the second value, and a multiplexer that receives the first value and the second value and outputs one corresponding to an output of the flip-flop as the control code.

In one embodiment, the logic unit may further include memory that captures an output of the multiplexer in response to assertion of an enable signal.

In one embodiment, the analog unit may include a capacitance array D/A converter that samples an analog input voltage, converts a control code into a threshold voltage, and outputs a signal corresponding to the analog input voltage and the threshold voltage, and a comparison circuit that receives an output of the capacitance array D/A converter and performs comparison processing.

In one embodiment, the successive approximation register D/A converter may be integrally integrated on one semiconductor substrate. The term "integrally integrated" includes a case where all components of a circuit are formed on the semiconductor substrate and a case where main components of the circuit are integrally integrated, and some resistors, capacitors, and the like may be provided outside the semiconductor substrate for adjusting a circuit constant. By integrating the circuit on one chip, a circuit area can be reduced, and characteristics of circuit elements can be kept uniform.

EMBODIMENT

Hereinafter, a preferred embodiment will be described with reference to the drawings. The same or equivalent components, members, and processing illustrated in the drawings are denoted by the same reference numerals, and redundant description will be omitted as appropriate. In addition, the embodiments are not intended to limit the disclosure and invention, but are merely examples, and all features described in the embodiments and combinations thereof are not necessarily essential to the disclosure and the invention.

In the present specification, the term "a state in which the member A is connected to the member B" includes not only a case where the member A and the member B are physically and directly connected to each other, but also a case where the member A and the member B are indirectly connected to each other via another member which does not substantially affect an electrical connection state between the members or which does not impair a function or an effect exhibited by coupling between the members.

Similarly, the term "a state in which the member C is connected (provided) between the member A and the member B." includes not only a case where the member A and the member C, or the member B and the member C are directly connected to each other, but also a case where the members are indirectly connected to each other via another member which does not substantially affect an electrical connection state between the members or which does not impair a function or an effect exhibited by the connection between the members.

FIG. 1 is a block diagram showing a basic configuration of a successive approximation register A/D converter (SARADC) 100. The SARADC 100 is integrally integrated on one semiconductor substrate. The SARADC 100 may be a dedicated chip of the A/D converter or may be integrated into an integrated circuit (IC) having another function.

First, input and output of the SARADC 100 will be described. The SARADC 100 converts an analog input voltage $V_{IN}$ input to an input terminal IN into output data ADCOUT [n−1:0] of digital n bits (n is an integer of 2 or more). The analog input voltage $V_{IN}$ may be a single end signal or a differential signal.

The SARADC 100 includes an analog unit 110 and a logic unit 120. The analog unit 110 samples the analog input voltage $V_{IN}$.

In an i-th (i=1, 2, . . . . K) conversion cycle (also simply referred to as a cycle), a digital control code $DAC_i$ is supplied from the logic unit 120 to the analog unit 110. The analog unit 110 generates a comparison signal COMP; indicating a magnitude relationship between the analog input voltage $V_{IN}$ and a threshold voltage $V_{THi}$ corresponding to the control code $DAC_i$.

For example, the analog unit 110 includes a sample and hold circuit (sample and hold function) 112, a D/A converter (D/A conversion function) 114, and a comparator (comparison function) 116. The sample and hold circuit 112 samples and holds the analog input voltage $V_{IN}$.

The D/A converter 114 converts the control code $DAC_i$ into the analog threshold voltage $V_{THi}$. The comparator 116 compares the analog input voltage $V_{IN}$ held by the sample and hold circuit 112 with the threshold voltage $V_{THi}$, and generates the comparison signal COMP; indicating a comparison result.

The sample and hold circuit 112, the D/A converter 114, and the comparator 116 in FIG. 1 indicate the function of the analog unit 110 for easy understanding, and do not limit the hardware configuration.

The logic unit 120 receives the comparison signal $COMP_i$ generated in the i-th cycle, and generates a control code DAC (i+1) instructing a threshold voltage $V_{TH\ (i+1)}$ of the next (i+1)-th cycle. The logic unit 120 outputs the digital output ADCOUT corresponding to a control code $DAC_K$ after completion of the conversion processing of K cycles.

Before describing a specific configuration of the redundant SARADC 100 according to the embodiment, a configuration of a redundant SARADC 100R according to a comparison technique will be described.

Figure 2:
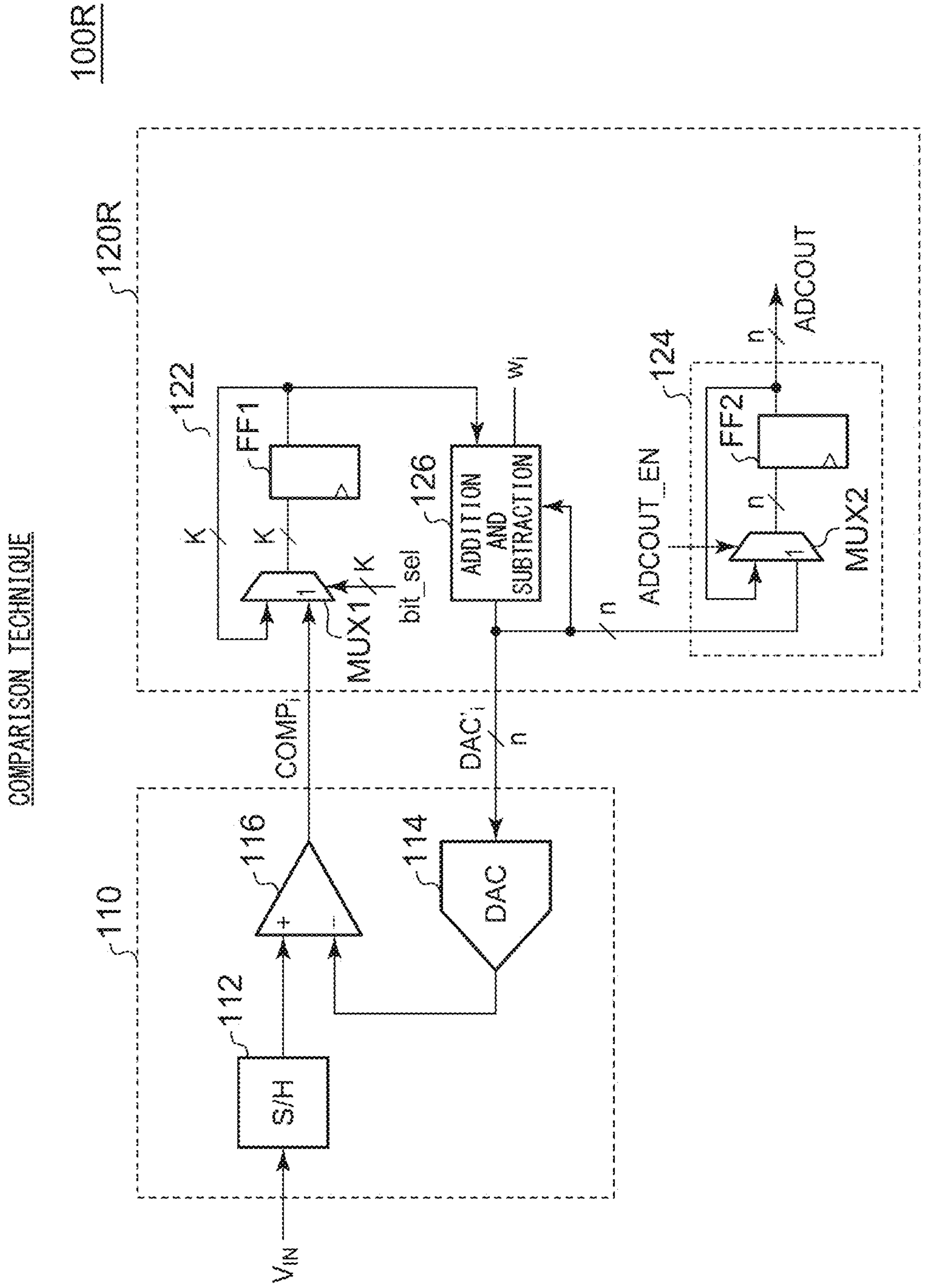
FIG. 2 is a block diagram showing a configuration example of a redundant SARADC according to a comparison technique.

FIG. 2 is a block diagram showing a configuration example of the redundant SARADC 100R according to the comparison technique. The SARADC 100R includes an analog unit 110 and a logic unit 120R. The configuration of the analog unit 110 is similar to that in FIG. 1. The logic unit 120R performs comparison of K cycles and generates the output signal ADCOUT. In the SARADC with a value of 2 as the radix, the number of bits n and the number of conversion cycles K (the number of steps) match to each other, but in the SARADC having redundancy, the number of conversion cycles K is larger than the number of bits n.

$w_i$ indicates a weight in the i-th cycle. In the SARADC with a value of 2 as the radix, the weight in the i-th cycle is $2^{n-i}$, but in the SARADC having redundancy, $w_i$ is different from $2^{n-i}$.

In the SARADC having redundancy, the weight $w_i$ of the i-th cycle is set based on the radix. When the value of the radix is M, $$w_j = \mathrm{Int}\left[M^{K-j}\right] \text{ where } 2 \leq j \leq K$$

Int[ ] is a function or operator representing integer conversion. The integer conversion is rounding off, rounding off of a decimal point, or a combination thereof, and is not particularly limited.

A weight $w_1$ of the 1st cycle is stet to $$w_1 = 2^n/2.$$

A bit selection signal bit_sel is a K bits signal indicating the current conversion cycle, and the i-th bit from the top is 1 and the remaining bits are 0 in the i-th cycle. Specifically, a most significant bit (MSB) is 1 and the remainders are 0 in the 1st cycle, and a least significant bit (LSB) is 1 and the remainders are 0 in the K-th cycle.

An enable signal ADCOUT_EN is a signal that is asserted after completion of K conversion cycles and determines the output ADCOUT.

The logic unit 120R includes a first memory 122, a second memory 124, and an addition/subtraction circuit 126. The first memory 122 holds comparison signals $COMP_1$ to $COMP_K$ over K cycles. For example, the first memory 122 includes a multiplexer MUX1 and a K bits flip-flop FF1. The multiplexer MUX1 receives the value of the flip-flop FF1 and the comparison signal $COMP_i$. A high-order j-th bit of an output of the multiplexer MUX1 is the comparison signal $COMP_i$ when a high-order j-th bit of the bit selection signal bit_sel is 1 and takes a value of a j-th bit of the output of the flip-flop FF1 when the j-th bit of the bit selection signal bit_sel is 0. Since only the high-order i-th bit of the bit selection signal bit_sel becomes 1 in the i-th cycle, the comparison signal $COMP_i$ is stored in the i-th bit of the flip-flop FF1, and the remaining bits of the flip-flop FF1 maintain their original values.

An initial value $w_i$ of the weight is input to the addition/subtraction circuit 126. The addition/subtraction circuit 126 adds or subtracts the initial value $w_i$ of the input a weight to or from the control code $DAC_i$ to update the control code $DAC_i$. The addition and the subtraction are determined based on the comparison signal $COMP_i$ of the i-th cycle.

When the ADCOUT_EN signal is asserted after the end of K cycles, the second memory 124 captures all bits of the control code DAC. For example, the second memory 124 includes a multiplexer MUX2 and a flip-flop FF2. The multiplexer MUX2 receives the outputs of the control code DAC and the flip-flop FF2. The multiplexer MUX2 selects the output of the flip-flop FF2 when the ADCOUT_EN is negated (0) and selects the control code DAC when the ADCOUT_EN is asserted (1).

The above is the configuration of the SARADC 100R according to the comparison technique. Next, the operation there of will be described. Here, n=5, and the radix M is 1.8. The number of conversion cycles K is set to 6.

At this time, the weight of each cycle can be the following value.

$$w_1 = 2^n/2 = 2^5/2 = 16$$
$$w_2 = \mathrm{Int}\left[1.8^{6-2}\right] \approx 10$$
$$w_3 = \mathrm{Int}\left[1.8^{6-3}\right] \approx 6$$
$$w_4 = \mathrm{Int}\left[1.8^{6-4}\right] \approx 3$$
$$w_5 = \mathrm{Int}\left[1.8^{6-5}\right] \approx 2$$
$$w_6 = \mathrm{Int}\left[1.8^{6-6}\right] \approx 1$$

Figure 3:
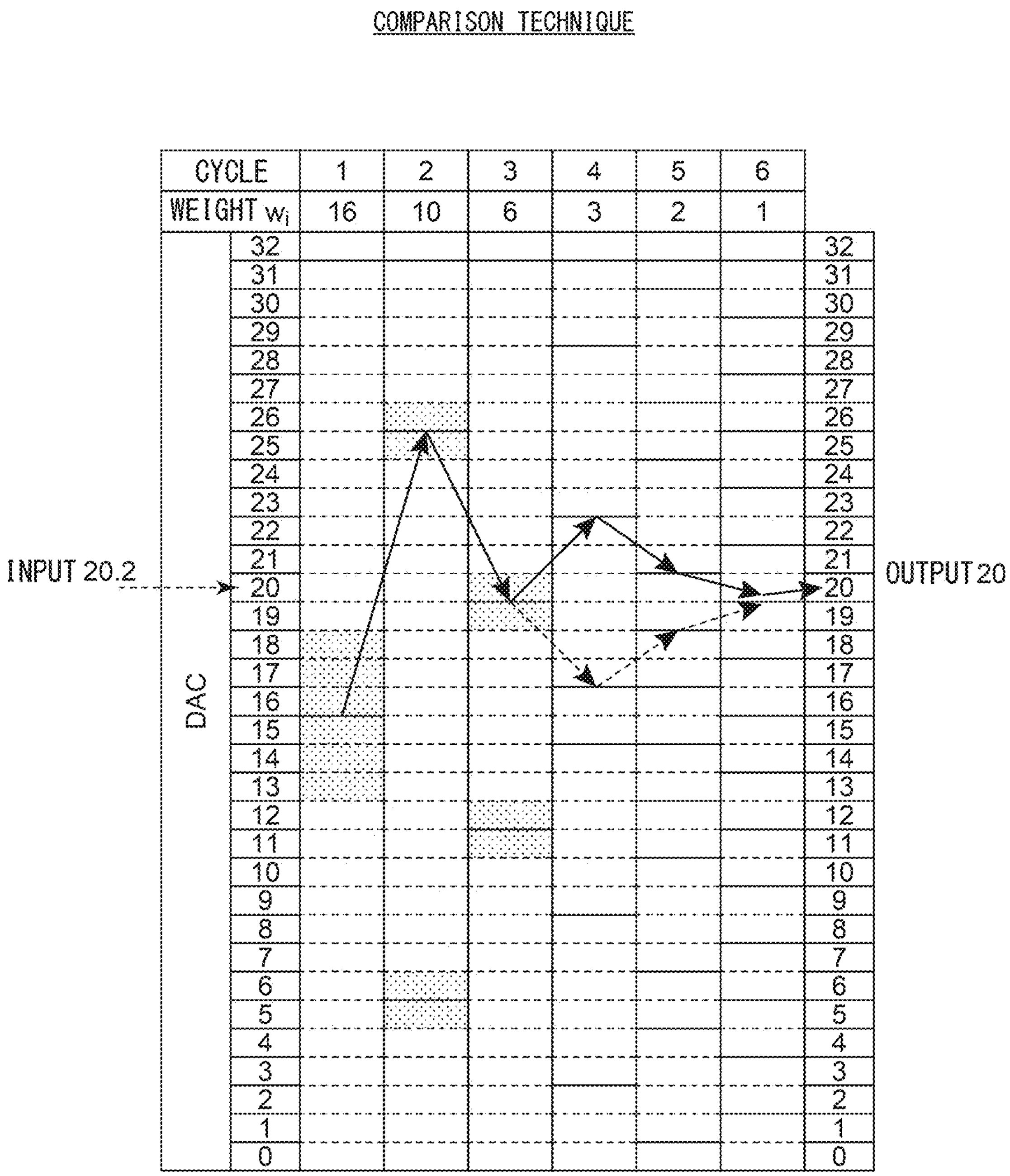
FIG. 3 is a diagram for describing an operation of the SARADC in FIG. 2.

FIG. 3 is a diagram for describing an operation of the SARADC 100R in FIG. 2. Consider a case where the analog input voltage $V_{IN}$ is a voltage corresponding to 20.2.

In the 1st cycle, the control code $DAC_1=w_1=16$. The analog input voltage $V_{IN}$ corresponding to 20.2 is compared with the threshold voltage $V_{TH1}$ corresponding to the control code $DAC_1=16$. As a result, the comparison signal $COMP_1$ at a first level (for example, H) indicating $V_{IN}>V_{TH1}$ is generated.

A control code $DAC_2$ in the 2nd cycle is calculated using the 1st comparison signal $COMP_1$. Specifically, $$DAC_2 = DAC_1 + w_2 = 16 + 10 = 26$$

is obtained.

In the 2nd cycle, the analog input voltage $V_{IN}$ corresponding to 20.2 is compared with a threshold voltage $V_{TH2}$ corresponding to the control code $DAC_2=26$. As a result, the comparison signal $COMP_2$ at a second level (for example, L) indicating $V_{IN}<V_{TH2}$ is generated.

A control code $DAC_3$ in the 3rd cycle is calculated using the 2nd comparison signal $COMP_2$. Specifically, $$DAC_3 = DAC_2 - w_3 = 26 - 6 = 20$$

is obtained.

In the 3rd cycle, the analog input voltage $V_{IN}$ corresponding to 20.2 is compared with a threshold voltage $V_{TH3}$ corresponding to the control code $DAC_3=20$. The difference between $V_{IN}$ and $V_{TH3}$ is smaller than a voltage width corresponding to the LSB of the SARADC 100R.

The operation in a case where it is correctly determined that $V_{IN}>V_{TH3}$ is indicated by a solid line, and the comparison signal $COMP_3$ at the first level (for example, H) is generated.

A control code $DAC_4$ in the 4th cycle is calculated using the 3rd comparison signal $COMP_3$. Specifically, $$DAC_4 = DAC_3 + w_4 = 20 + 3 = 23$$

is obtained.

In the 4th cycle, the analog input voltage $V_{IN}$ corresponding to 20.2 is compared with a threshold voltage $V_{TH4}$ corresponding to the control code $DAC_4$=23. As a result, a comparison signal $COMP_4$ at the second level (for example, L) indicating $V_{IN}<V_{TH4}$ is generated.

A control code $DAC_5$ in the 5th cycle is calculated using the 4th comparison signal $COMP_4$. Specifically, $$DAC_5 = DAC_4 + w_5 = 23 - 2 = 21$$

is obtained.

In the 5th cycle, the analog input voltage $V_{IN}$ corresponding to 20.2 is compared with a threshold voltage $VTH_{TH5}$ corresponding to the control code $DAC_5$=21. As a result, a comparison signal $COMP_5$ at the second level (L) indicating $V_{IN}<V_{TH5}$ is generated.

A control code $DAC_6$ in the 6th cycle is calculated using the 5th comparison signal $COMP_5$. Specifically, $$DAC_6 = DAC_5 - w_6 = 21 - 1 = 20$$

is obtained. Then, the enable signal ADCOUT_EN is asserted, and the control code $DAC_6$ is captured.

In the 3rd cycle, an operation when it is erroneously determined that $V_{IN}<V_{TH3}$ is indicated by a broken line. At this time, the comparison signal $COMP_3$ at the second level (L) is generated.

A control code $DAC_4$ in the 4th cycle is calculated using the 3rd comparison signal $COMP_3$. Specifically, $$DAC_4 = DAC_3 - w_4 = 20 - 3 = 17$$

is obtained.

In the 4th cycle, the analog input voltage $V_{IN}$ corresponding to 20.2 is compared with the threshold voltage $V_{TH4}$ corresponding to the control code $DAC_4$=17. As a result, comparison signal $COMP_4$ at the first level (H) indicating $V_{IN}>V_{TH4}$ is generated.

A control code $DAC_5$ in the 5th cycle is calculated using the 4th comparison signal $COMP_4$. Specifically, $$DAC_5 = DAC_4 + w_5 = 17 + 2 = 19$$

is obtained.

In the 5th cycle, the analog input voltage $V_{IN}$ corresponding to 20.2 is compared with the threshold voltage $V_{TH5}$ corresponding to the control code $DAC_5$=19. As a result, the comparison signal $COMP_5$ at the first level (H) indicating $V_{IN}>V_{TH5}$ is generated.

A control code $DAC_6$ in the 6th cycle is calculated using the 5th comparison signal $COMP_5$. Specifically, $$DAC_6 = DAC_5 + w_6 = 19 + 1 = 20$$

is obtained. Then, the enable signal ADCOUT_EN is asserted, and the control code $DAC_6$ is captured.

As described above, in the SARADC 100R having redundancy, even when erroneous determination occurs in an intermediate cycle, a final correct conversion result can be obtained. In FIG. 3, a range in which a correct output can be obtained when a mistake occurs in the comparison is hatched.

As a result of studying the SARADC 100R in FIG. 2, the present inventor has recognized the following problem. In the SARADC 100R in FIG. 2, a polarity of the addition and subtraction when calculating the control code of a next cycle is determined by the comparison result $COMP_i$ of the i-th cycle. That is, after the comparison result COMP; is determined, the control code of the next cycle is calculated, so that the control delay increases. This problem becomes more significant as the number of bits n is larger, which hinders high-speed conversion.

Hereinafter, the SARADC 100A capable of solving this problem will be described.

Embodiment 1

Figure 4:
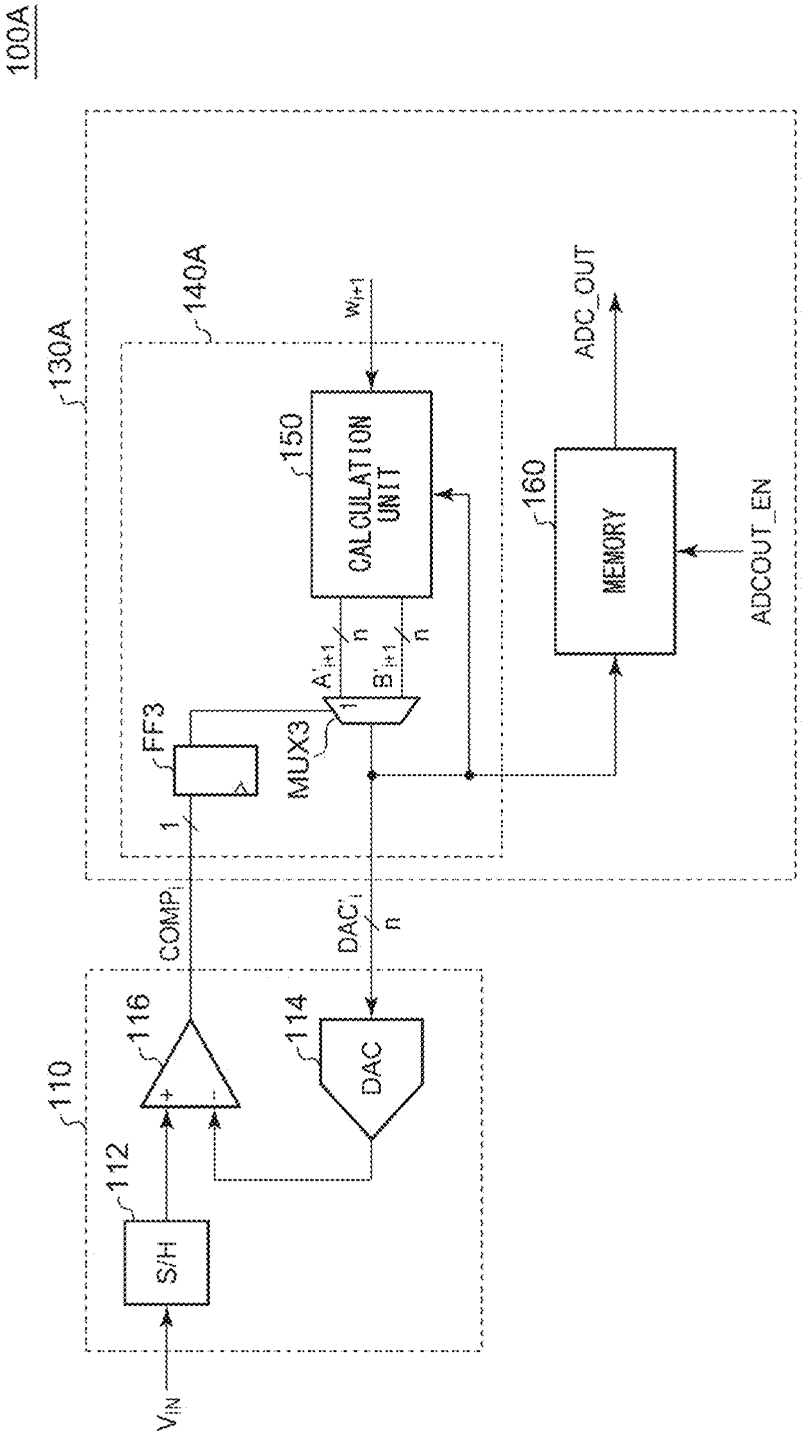
FIG. 4 is a circuit diagram of an SARADC according to Embodiment 1.

FIG. 4 is a circuit diagram of an SARADC 100A according to Embodiment 1. The SARADC 100A includes an analog unit 110 and a logic unit 130A.

The logic unit 130A includes a control code generation unit 140A and a memory 160.

The control code generation unit 140A includes a flip-flop FF3, a calculation unit 150, and a multiplexer MUX3.

The flip-flop FF3 holds the comparison signal COMP; from the analog unit 110.

Before the comparison signal COMP; is determined in the i-th cycle, the control code generation unit 140A calculates a first value $A_{i+1}$ and a second value $B_{i+1}$, which are two candidates of the control code $DAC_{i+1}$ in the next ((i+1)-th) cycle.

$$A_{i+1} = DAC_i + W_{i+1}$$

$$B_{i+1} = DAC_i - W_{i+1}$$

When the comparison signal $COMP_i$ is determined, the multiplexer MUX3 selects one of the two candidate values $A_{i+1}$ and $B_{i+1}$. corresponding to the comparison signal $COMP_i$. For example, when the comparison signal COMP; is at the first level (for example, H) indicating $V_{IN}>V_{THi}$, the first value $A_{i+1}$ is selected, and when the comparison signal COMP; is at the second level (for example, L) indicating $V_{IN}<V_{THi}$, the second value $A_{i+1}$ is selected. An output of the multiplexer MUX3 is the control code $DAC_{i+1}$ in the next cycle.

The memory 160 is a data latch that captures the control code DAC at a time when the enable signal ADCOUT_EN is asserted, and outputs the captured control code as the output signal ADCOUT.

Figure 5:
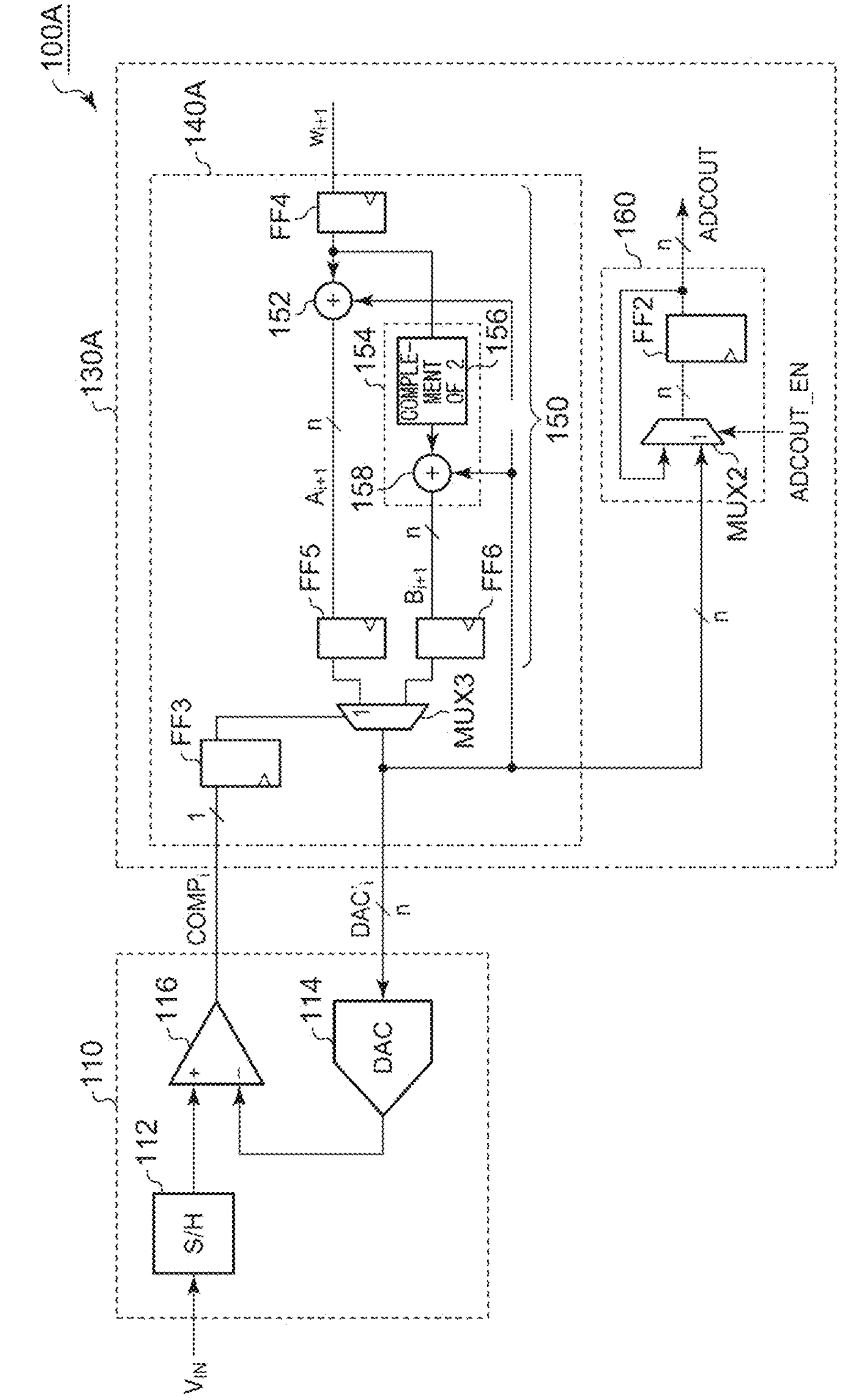
FIG. 5 is a diagram showing a specific configuration example of the SARADC in FIG. 4.

FIG. 5 is a diagram showing a specific configuration example of the SARADC 100A in FIG. 4. The calculation unit 150 includes flip-flops FF4 to FF6, an adder 152, and a subtractor 154.

The flip-flop FF4 stores a weight $w_{i+1}$ of the next cycle. The adder 152 adds the control code $DAC_i$, which is the output of the multiplexer MUX3, and the weight $w_{i+1}$ to generate the first value $A_{i+1}$. The flip-flop FF5 stores the first value $A_{i+1}$.

The subtractor 154 subtracts the weight $w_i$+1 from the control code $DAC_i$, which is the output of the multiplexer MUX3, to generate the second value $B_{i+1}$. The flip-flop FF6 stores the second value $B_{i+1}$. For example, the subtractor 154 includes a complement circuit 156 that generates a complement of 2 of the weight $w_{i+1}$, which is the output of the flip-flop FF4, and an adder 158 that adds an output of the complement circuit 156 and the control code $DAC_i$, which is the output of the multiplexer MUX3.

The memory 160 can be configured similarly to the second memory 124 in FIG. 2.

The above is the configuration of the SARADC 100A.

In the SARADC 100A, the calculation in the calculation unit 150 is provided outside a loop including the comparator 116 and the D/A converter 114, and the two candidate values $A_{i+1}$ and $B_{i+1}$ can be previously calculated without waiting for determination of the comparison signal $COMP_i$. As a result, when the comparison signal $COMP_i$ is determined, one of the two candidate values $A_{i+1}$ and $B_{i+1}$ is selected according to the comparison signal $COMP_i$, so that the control code $DAC_{i+1}$ of the next cycle can be immediately determined, and the process can move to the next cycle.

As a result, the delay can be reduced as compared with the comparison technique, and high-speed A/D conversion can be performed.

Embodiment 2

Figure 6:
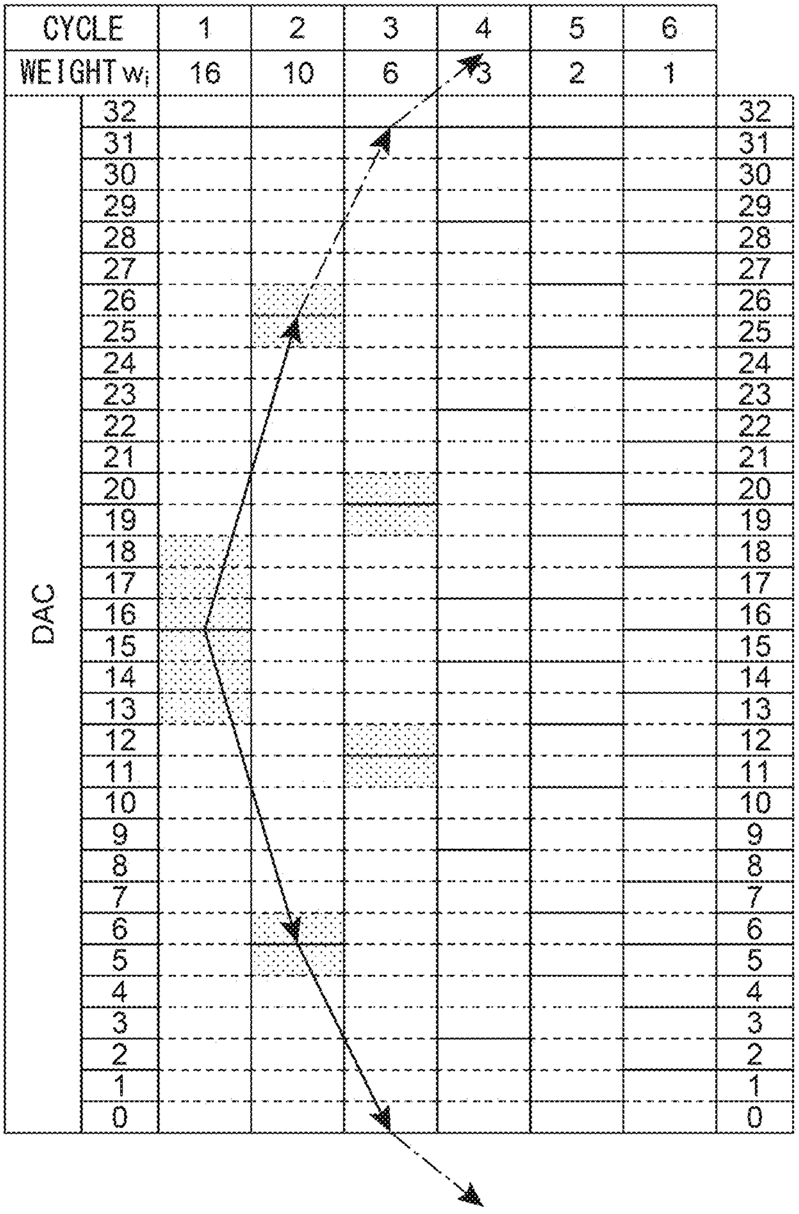
FIG. 6 is a diagram showing one example of an operation of the SARADC in FIG. 5.

A problem that may occur in the SARADC 100A in FIG. 5 will be described. FIG. 6 is a diagram showing one example of an operation of the SARADC 100A in FIG. 5. In the 2nd cycle, it is assumed that $DAC_2$=26. In a case where the comparison signal $COMP_2$ obtained as a result is H, the control code $DAC_3$ of the next cycle becomes 26+6=32, and overflows beyond a maximum value 31 of the control code DAC. Then, the analog unit 110 cannot be operated correctly.

Similarly, in the 3rd cycle, it is assumed that $DAC_3$=0. In a case where the comparison signal $COMP_3$ obtained as a result is L, the control code $DAC_4$ of the next cycle becomes 0-3=−3, becomes smaller than 0, which is the minimum value of the control code DAC, and underflows. Then, the analog unit 110 cannot be operated correctly.

This problem can be solved by correcting the SARADC 100A as follows.

Figure 7:
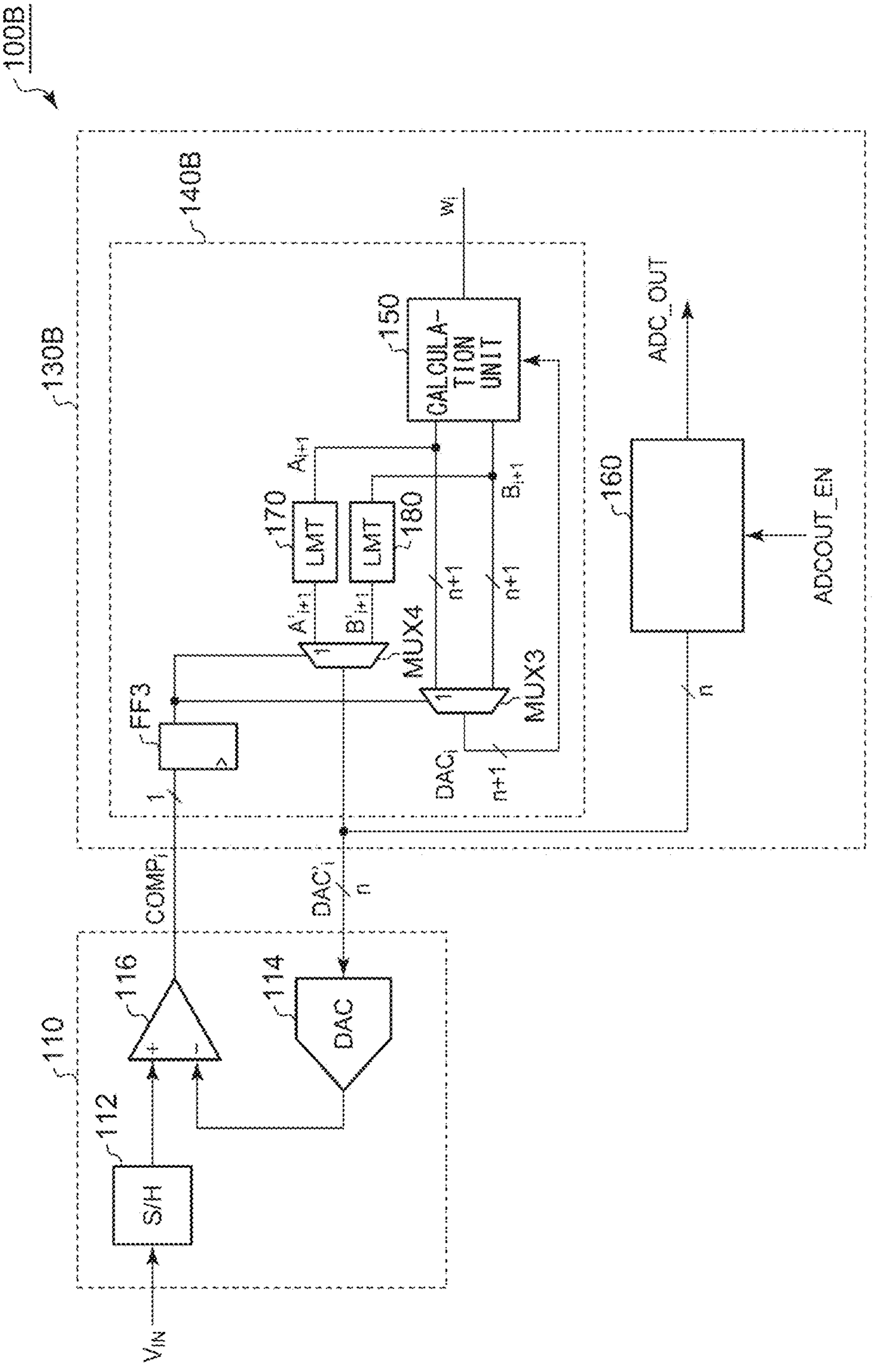
FIG. 7 is a circuit diagram of an SARADC according to Embodiment 2.

FIG. 7 is a circuit diagram of an SARADC 100B according to Embodiment 2. The SARADC 100B includes an analog unit 110 and a logic unit 130B.

The logic unit 130B includes a control code generation unit 140B and the memory 160. The control code generation unit 140B includes a first limiter 170, a second limiter 180, and a multiplexer MUX4 in addition to the control code generation unit 140A in FIG. 4. The first limiter 170 limits the first value $A_{i+1}$ to a predetermined upper limit value or less. For example, the upper limit value is the maximum value of the control code DAC, and is 31 in the case of 5 bits.

The second limiter 180 limits the second value $A_{i+1}$ to a predetermined lower limit value or more. For example, the lower limit value is a minimum value of the control code DAC and is 0.

The multiplexer MUX4 receives a first value A'i+1 output from the first limiter 170 and a second value B'i+1 output from the second limiter 180, and selects one corresponding to the output of the flip-flop FF3. An output DAC' of the multiplexer MUX4 is supplied to the analog unit 110 instead of the output of the multiplexer MUX3.

Note that, in FIG. 7, a bit width of the calculation unit 150 is expanded to n+1, and the control data DAC can express negative numbers and numbers of greater than 31.

Figure 8:
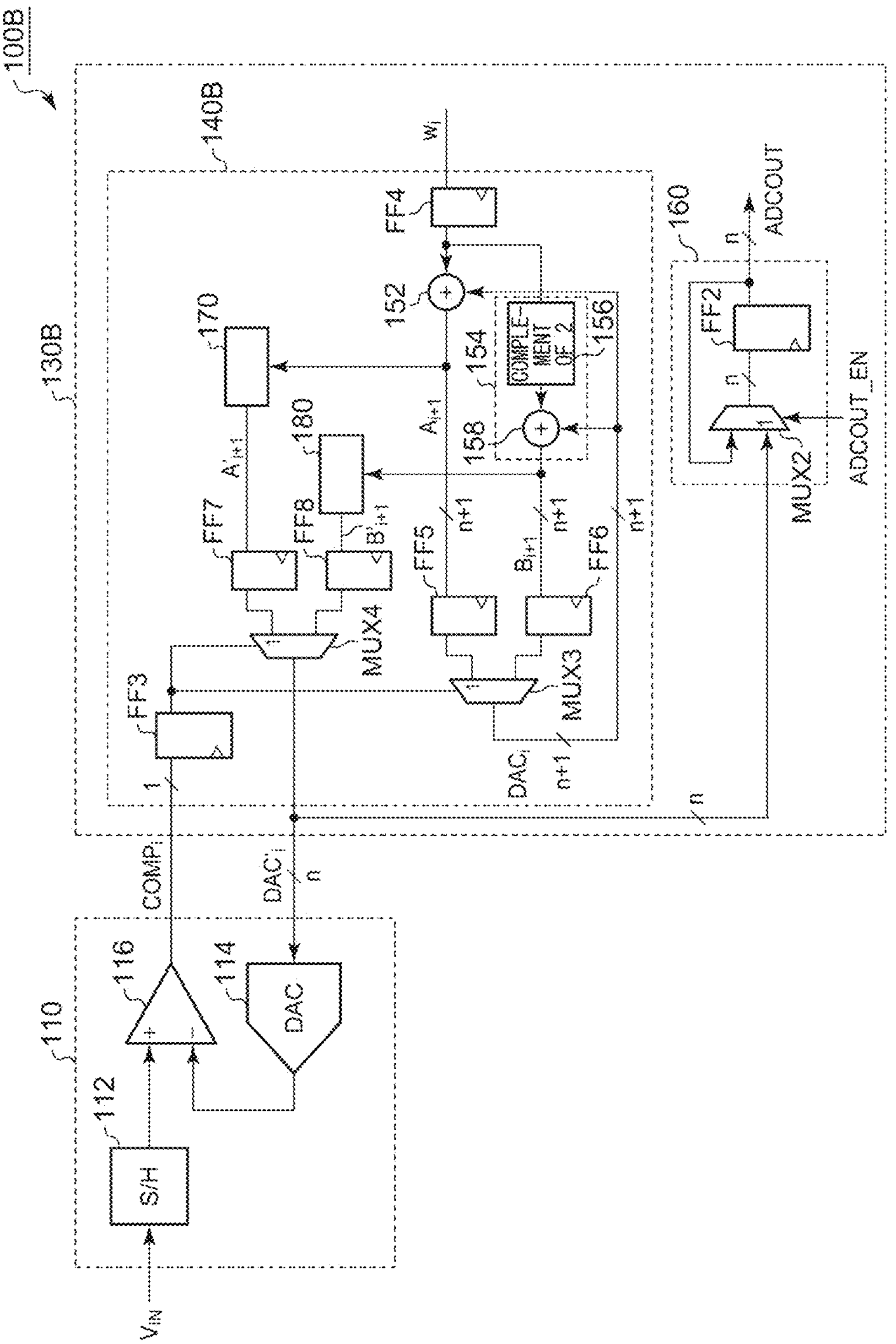
FIG. 8 is a circuit diagram showing a specific configuration example of the SARADC in FIG. 7.

FIG. 8 is a circuit diagram showing a specific configuration example of the SARADC 100B in FIG. 7. The control code generation unit 140B in FIG. 8 includes the first limiter 170, the second limiter 180, flip-flops FF7 and FF8, and the multiplexer MUX4 in addition to the control code generation unit 140A in FIG. 5. The flip-flops FF7 and FF8 hold the first values $A'_{i+1}$ and $B'_{i+1}$, respectively, after the limit. The multiplexer MUX4 selects one of the outputs of the flip-flops FF7 and FF8 corresponding to the output of the flip-flop FF3 and supplies the selected output to the analog unit 110.

Figure 9:
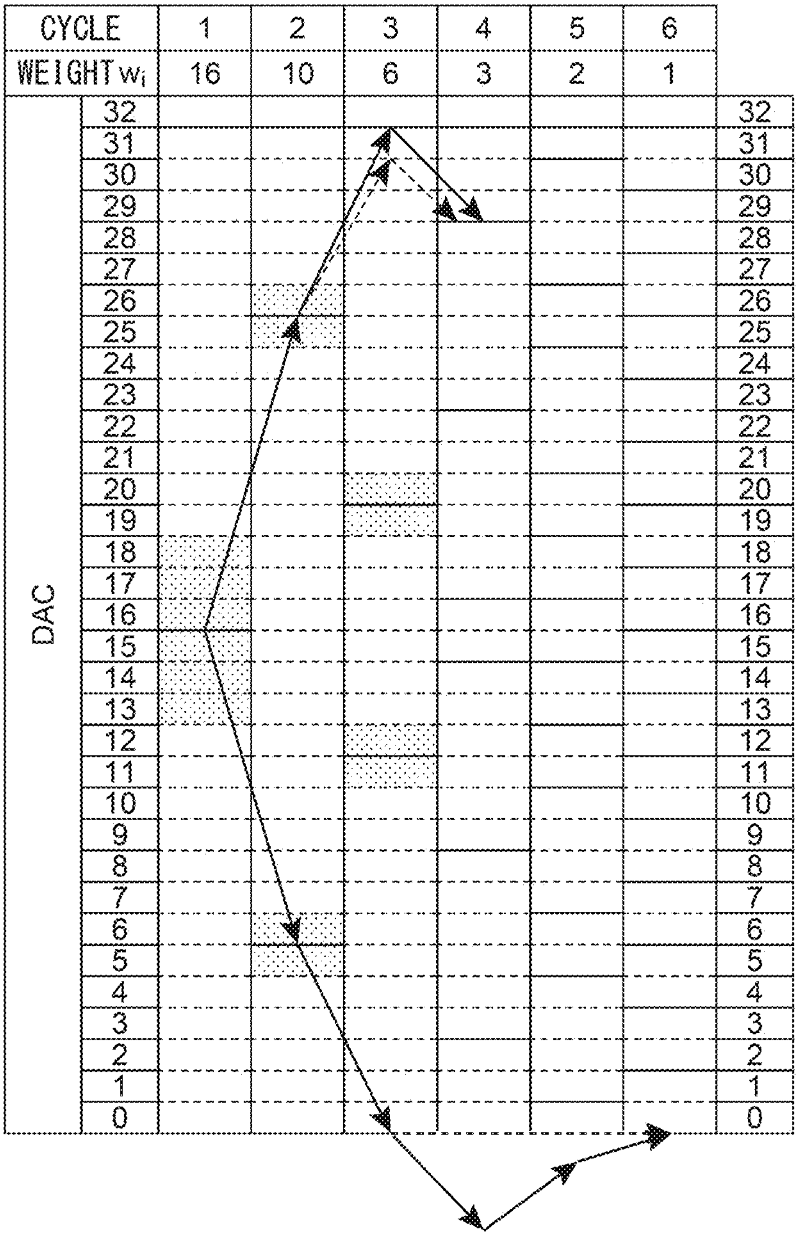
FIG. 9 is a diagram for describing one example of an operation of the SARADC in FIG. 7.

FIG. 9 is a diagram for describing one example of an operation of the SARADC 100B in FIG. 7. In FIG. 9, an n bits control code DAC' after the limit is indicated by a broken line, and an (n+1) bits control code DAC that is not limited is indicated by a solid line.

In the 2nd cycle, it is assumed that $DAC_2$=26. In a case where the comparison signal $COMP_2$ obtained as a result is H, the control code $DAC_3$ of the next cycle becomes 26+6=32, but the value thereof is maintained without overflow. On the other hand, the control code DAC' whose value is limited to 31 is supplied to the analog unit 110.

As a result, when the low comparison signal $COMP_3$ is obtained, the control code $DAC_4$ of the next cycle becomes 32−3=29. The control code DAC'4 at this time also becomes the same value 29. Thus, the A/D conversion can be completed while holding the correct conversion result (control code).

The same applies to the underflow.

As described above, according to Embodiment 2, even when a state of the overflow or the underflow temporarily occurs, the A/D conversion can be completed while holding the correct conversion result (control code).

It is understood by those skilled in the art that the above-described embodiments are exemplary, and various variations exist in combinations of the respective components and the respective processing processes. Hereinafter, such variations will be described.

Variation 1

Figure 10:
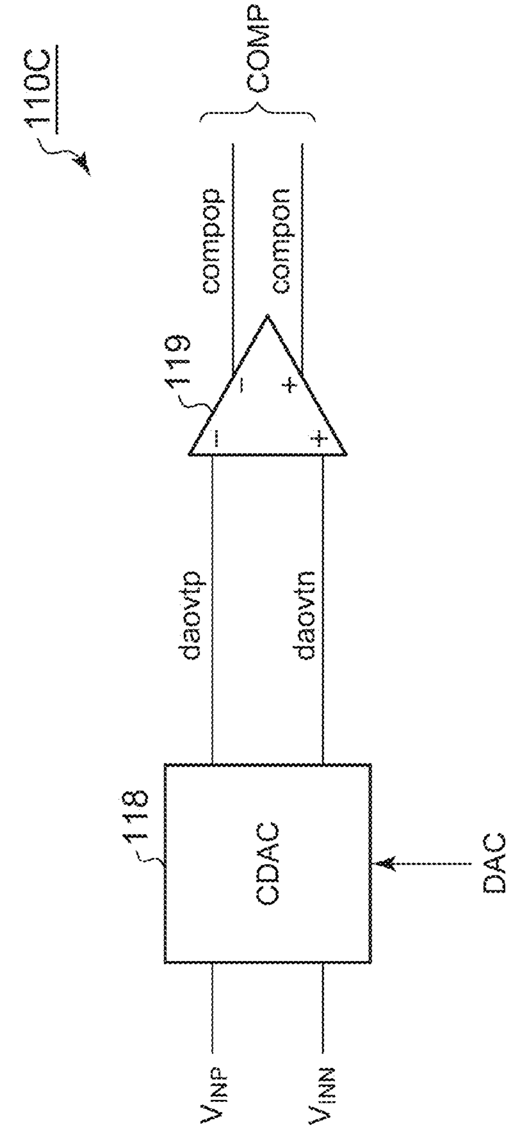
FIG. 10 is a circuit diagram of an analog unit according to Variation 1.

FIG. 10 is a circuit diagram of an analog unit 110C according to Variation 1. The analog unit 110C includes a capacitance array D/A converter 118 and a comparison circuit 119. The capacitance array D/A converter 118 includes a plurality of capacitors and a plurality of switches. The capacitance array D/A converter 118 samples a differential analog input voltages $V_{INP}$ and $V_{INN}$.

In addition, the capacitance array D/A converter 118 generates differential threshold voltages $V_{THPi}$ and $V_{THNi}$ corresponding to the control code $DAC_i$ in the i-th cycle.

The capacitance array D/A converter 118 outputs signals daoutp and daoutn corresponding to the differential inputs $V_{INP}$ and $V_{INN}$ and the differential threshold voltages $V_{THP}$ and $V_{THN}$, respectively. For example, the following relational expressions are established.

$$daoutp = A \times (V_{INP} - V_{THPi})$$

-continued $$daoutn = A \times (V_{INN} - V_{THNi})$$

A is a gain.

The comparison circuit 119 receives the outputs daoutp and daoutn of the capacitance array D/A converter 118 and performs comparison processing. The comparison signal COMP, which is an output of the comparison circuit 119, becomes high (H) when daoutp<daoutn and low (L) when daoutp>daoutn. That is, the comparison signal COMP indicates a comparison result between the signal component ($V_{INP}$-$V_{INN}$) of the differential input and the signal component ($V_{THP}$-$V_{THN}$) of the reference voltage.

It is to be understood by those skilled in the art that the embodiments are exemplary, various variations exist in combinations of the respective components and the respective processing processes, and such variations are also included in the scope of the present disclosure or the present invention.

APPENDIX

The following techniques are disclosed herein.

Item 1. A successive approximation register A/D converter having redundancy that converts an analog input voltage into a digital output, the successive approximation register A/D converter including:

an analog unit that samples the analog input voltage and generates a comparison signal indicating a magnitude relationship between a threshold voltage corresponding to a control code and the analog input voltage; and a logic unit that generates the control code of a next cycle corresponding to the comparison signal for each cycle, in which the logic unit generates, in an i-th (i≥1) cycle, a first value obtained by adding a weight of an (i+1)-th cycle to the control code of the i-th cycle and a second value obtained by subtracting the weight of the (i+1)-th cycle from the control code of the i-th cycle, and when the comparison signal of the i-th cycle is determined, supplies one of the first value and the second value corresponding to the comparison signal to the analog unit as the control code of the (i+1)-th cycle.

Item 2. The successive approximation register A/D converter according to item 1, further including a first limiter that limits the first value to a predetermined upper limit value.

Item 3. The successive approximation register A/D converter according to item 1 or 2, further including a second limiter that limits the second value to a predetermined lower limit value.

Item 4. The successive approximation register A/D converter according to any one of items 1 to 3, wherein the logic unit includes a flip-flop that holds the comparison signal, a calculation unit that calculates the first value and the second value, and a multiplexer that receives the first value and the second value and outputs one of the first value and the second value corresponding to an output of the flip-flop as the control code.

Item 5. The successive approximation register A/D converter according to item 4, wherein the logic unit further includes memory that captures the output of the multiplexer in response to assertion of an enable signal.

Item 6. The successive approximation register A/D converter according to any one of items 1 to 5, wherein the analog unit includes a capacitance array D/A converter that samples the analog input voltage, converts the control code into a threshold voltage, and outputs a signal corresponding to the analog input voltage and the threshold voltage, and a comparison circuit that receives the output of the capacitance array D/A converter and performs comparison processing.

Item 7. The successive approximation register A/D converter according to any one of items 1 to 6, wherein the successive approximation register A/D converter is integrally integrated on one semiconductor substrate.

What is claimed is:

1. A successive approximation register A/D converter having redundancy structured to convert an analog input voltage into a digital output, the successive approximation register A/D converter comprising:

an analog unit structured to sample the analog input voltage and generate a comparison signal indicating a magnitude relationship between a threshold voltage corresponding to a control code and the analog input voltage; and a logic unit structured to generate the control code of a next cycle corresponding to the comparison signal for each cycle, wherein the logic unit is structured to generate, in an i-th (i≥1) cycle and before the determination of the comparison signal of the i-th cycle, both a first value obtained by adding a weight of an (i+1)-th cycle to the control code of the i-th cycle and a second value obtained by subtracting the weight of the (i+1)-th cycle from the control code of the i-th cycle, and wherein the logic unit is structured to, when the comparison signal of the i-th cycle is determined, supply one of the first value and the second value corresponding to the comparison signal to the analog unit as the control code of the (i+1)-th cycle.

2. The successive approximation register A/D converter according to claim 1, further comprising a first limiter structured to limit the first value to a predetermined upper limit value.

3. The successive approximation register A/D converter according to claim 1, further comprising a second limiter structured to limit the second value to a predetermined lower limit value.

4. The successive approximation register A/D converter according to claim 1, wherein the logic unit includes a flip-flop structured to hold the comparison signal, a calculation unit structured to calculate the first value and the second value, and a multiplexer structured to receive the first value and the second value and output one of the first value and the second value corresponding to an output of the flip-flop as the control code.

5. The successive approximation register A/D converter according to claim 4, wherein the logic unit further includes memory structured to capture the output of the multiplexer in response to assertion of an enable signal.

6. The successive approximation register A/D converter according to claim 1, wherein the analog unit includes a capacitance array D/A converter structured to sample the analog input voltage, convert the control code into a threshold voltage, and output a signal corresponding to the analog input voltage and the threshold voltage, and a comparison circuit structured to receive the output of the capacitance array D/A converter and perform comparison processing.

7. The successive approximation register A/D converter according to claim 1, wherein the successive approximation register A/D converter is integrally integrated on one semiconductor substrate.

* * * * *